United States Patent
Ota et al.

(10) Patent No.: US 6,229,830 B1
(45) Date of Patent: May 8, 2001

(54) BURST-MODE LASE TECHNIQUES

(75) Inventors: Yusuke Ota, Mountain Lakes; Eduard Sackinger, Shrewsbury, both of NJ (US)

(73) Assignee: Agere Systems Optoelectronics Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/112,548

(22) Filed: Jul. 9, 1998

(51) Int. Cl.$^7$ ........................................................ H01S 5/06
(52) U.S. Cl. ............................ 372/31; 327/337; 372/38.1
(58) Field of Search ................................ 372/29, 30, 38, 372/31, 38.1, 38.02; 327/337

(56) References Cited

U.S. PATENT DOCUMENTS 5,936,986 * 8/1999 Cantatore et al. ...................... 372/31

OTHER PUBLICATIONS

T. Inoue et al: "Burst–mode CMOS LD driver IC for 156 Mbit/s transmission", Electronics Letters: vol. 33, No. 9, Apr. 24, 1997.

N. Ishihara et al: "3.3V, 50Mb/s CMOS Transceiver for Optical Burst–Mode Communication", 1997 IEEE International Solid–State Circuits Conference Feb. 1997 Digest of Technical Papers, vol. 40, ISSN 0193–6530/Paper FP 15.4.

* cited by examiner

*Primary Examiner*—James W. Davie
(74) *Attorney, Agent, or Firm*—Eugene J. Rosenthal

(57) ABSTRACT

Power control for a laser is performed on at least a per-packet basis, rather than a per-pulse basis, and that end-of-life detection may similarly be performed. This is achieved by accumulating the current generated by a photodiode in response to the light signal generated by the laser, subtracting therefrom a preset threshold current which is similarly modulated in response to the data signal used to drive the laser, and comparing the resulting difference to the value prior to having begun accumulating and subtracting. The result of the comparison, which may be filtered, is used to control the driver of the laser or as an indicator, e.g., for use in end-of-life detection.

37 Claims, 1 Drawing Sheet

BURST-MODE LASE TECHNIQUES

TECHNICAL FIELD

This invention relates to the art of controlling generated signals, and more particularly, to controlling the output power of a laser used for burst mode transmission in a passive optical network (PON).

BACKGROUND OF THE INVENTION

In prior art passive optical networks using a bursty signal format power control for the laser requires high speed circuitry, because the power of each light pulse is measured and controlled. Such high speed circuitry is expensive, and consumes substantial power.

SUMMARY OF THE INVENTION

We have recognized that when using a bursty signal format power control for the laser may be performed on at least a per-packet basis, rather than a per-pulse basis, and that end-of-life detection may similarly be performed. This is achieved by accumulating the current generated by a photodiode in response to the light signal generated by the laser, subtracting therefrom a preset threshold current which is similarly modulated in response to the data signal used to drive the laser, and comparing the resulting difference to the value prior to having begun accumulating and subtracting. The result of the comparison, which may be filtered, is used to control the driver of the laser.

Computationally, this is similar to integrating the current generated by the photodiode in response to the signal generated by the laser; dividing by the number of bits which drove the laser to generate light and further dividing by the length of one bit, so as to find the average peak magnitude of the bits over a packet; and comparing this average peak magnitude with a preset threshold which is set to the current level which would be generated by the photodiode when the laser is supplying the desired power level for typical use, e.g., as specified by a user. Advantageously, because the average peak magnitude over a packet is used, slower components may be employed, reducing both cost and power consumption.

Additionally, by using a different threshold current, e.g., one-half of the current level which would be generated by the photodiode when the laser is supplying the desired power level for typical use, end-of-life detection for the laser may be achieved.

DETAILED DESCRIPTION

Figure 1:
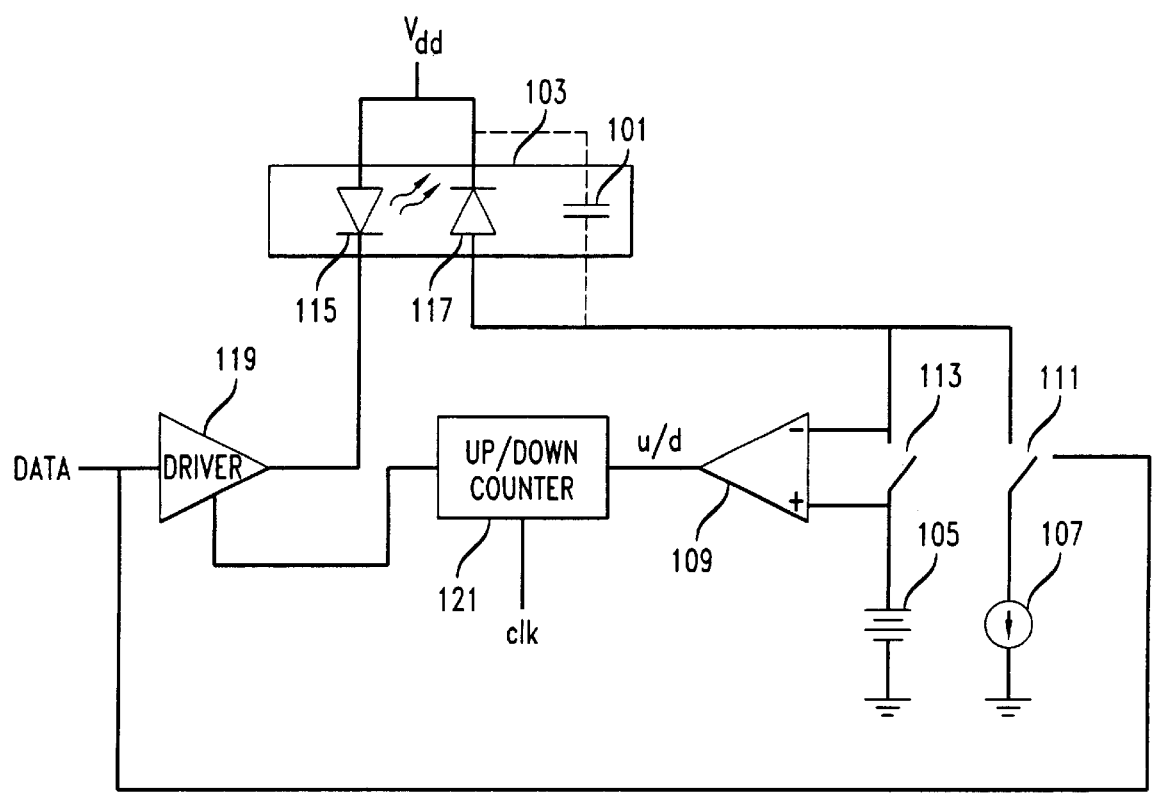
FIG. 1 shows an exemplary power control for a source in accordance with the principles of the invention.

The following merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intend intended to encompass both structural and functional equivalents thereof. Additionally, it is intended that such equivalents include both currently known equivalents as well as equivalents developed in the future, i.e., any elements developed that performs the same function, regardless of structure.

Thus, for example, it will be appreciated by those skilled in the art that the block diagrams herein represent conceptual views of illustrative circuitry embodying the principles of the invention. The functions of the various elements shown in the FIGs., including functional blocks labeled as "processors" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementor as more specifically understood from the context.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

FIG. 1 shows an exemplary power control for a source in accordance with the principles of the invention. More specifically, shown in FIG. 1 are a) current source 103, b) precharge voltage source 105, c) threshold current source 107, d) comparator 109, e) switches 111 and 113, f) controllable gain driver 119, and g) up/down counter 121.

Current source 103 generates current pulses. When used to control laser power, such as for use in a passive optical network (PON), source 103 may be made up of photodiode 117 which is optically coupled to laser 115. The current signal output by photodiode 117 is directly proportional to the output power supplied by laser 115. Photodiode 117 is considerably more stable than laser 115 in terms of their respective responses to temperature and age variations. As a result, changes in the signal supplied as an output from photodiode 117 reflect, essentially, changes in the output of laser 115. The pulses supplied from source 103 are grouped in packets, which may be supplied in a bursty manner.

Capacitor 101, which is shown explicitly as part of source 103, may be a parasitic capacitance of photodiode 117.

Alternatively, an explicit capacitor may be used, or an explicit capacitor may be used in conjunction with the parasitic capacitance of photodiode 117.

In operation, prior to the beginning of a packet, e.g., during an interpacket quiescent interval and/or during a preceding packet that is not used for power measurement, reset switch 113 is closed. This precharges capacitor 101 to the voltage of precharge voltage source 105. Note that the length of time that reset switch 113 is closed should be sufficient to accurately precharge capacitor 101 to the voltage of precharge voltage source 105. Such precharging may be achieved more rapidly if switch 113 and voltage source 105 have a low on-resistance. Thereafter, reset switch 113 is opened.

The packet is then transmitted, e.g., by supplying data bits to controllable gain driver 119, which in turn drives laser 115. The power generated for any bit for which laser 115 supplies a pulse of light is a function of the power supplied by controllable gain driver 119 and the ability of laser 115 to turn that power into light, which is influenced by factors such as its composition, age, and temperature. The amplitude of the output signal of controllable gain driver 119, e.g., the gain of controllable gain driver 119, is controllable, e.g., digitally by specifying various gains using binary inputs, or via an analog control arrangement (not shown).

During the period of transmission, switch 111 closes each time a pulse of light is generated by laser 115 for the duration light is emitted. This causes current pulses to be injected from threshold current source 107 into capacitor 101. The magnitude of the injected current pulses is the threshold level against which the output of source 103 is being compared. The values selected for such threshold level will be described more fully hereinbelow. Preferably, the parasitic capacitance of current source 107 is made as small as possible in order to minimize charge injection from its parasitic capacitance.

Note that in order to inject the right amount of charge into capacitor 101 it is important that the duration for which switch 111 is closed substantially matches the duration of the current generated by photodiode 117 in response to light generated by laser 115. If pulse-width distortions occur in driver 119, laser 115, or photodiode 117, they can either be precompensated for before the data is supplied to driver 119 or else the signal controlling switch 111 must be distorted in substantially the same distortion caused by driver 119, laser 115, and photodiode 117. Also, switch 111 as well as switch 113 must be designed to minimize unwanted charge injection into capacitor 101, e.g., from the switches controlling signal, in order to obtain accurate operation of the peak comparator. This may be achieved by implementing switches 111 and 113 using small, symmetric CMOS switches.

During the transmission of the packet there is integration by capacitor 101 of the output current of photodiode 117 and the current pulses injected from threshold current source 107. The injected current pulses from threshold current source 107 and the output of photodiode 117 are arranged to combine in a subtractive manner. As a result, if the injected current from threshold current source 107 and the peak current output of photodiode 117 are not substantially identical, the voltage on capacitor 101 may change, i.e., it will either increase or decrease.

At the end of the packet transmission, the resulting voltage on capacitor 101 is compared against the voltage of precharge voltage source 105 by comparator 109, with the result of the comparison being indicated by the output of comparator 109. Note that comparator 109 may be a clocked comparator, so that is uses no power except when it is instructed by the clock to perform the comparison. For use in power control, the output of comparator 109 may be filtered, e.g., by up/down counter 121, and the filtered output is supplied to controllable gain driver 119, which controls the magnitude of the signal driving laser 115.

The power level is only changed in between packets, so that an essentially constant power level is employed to driver laser 115 during the packet.

When performing power control, current source 107 is set to the peak current level which would be generated by photodiode 117 when laser 115 is supplying the desired power level for typical use, as specified by a user.

Similarly, for use in performing end-of-life detection threshold current source 107 is set to the peak current level which would be generated by photodiode 117 when laser 115 is nearing the end of its useful life as specified by the user, e.g., one half or one third of the power level desired for typical use.

Other levels for threshold current source 107 may be used for other user specified functions, e.g., to provide an early end of life warning, or other function desired by the user. Those of ordinary skill in the art will be able to develop such functions and specify appropriate thresholds therefor.

The particular thresholds used may be multiplexed on a per-packet basis, and the output of comparator 109 demultiplexed accordingly, so that for different packets a different function may be performed.

What is claimed is:

1. An apparatus, comprising:
   an integrator for integrating (i) a signal representing bits in a packet generated by a source and (ii) an injected current which is a function of a threshold level, said integrator being first precharged to a specified voltage level; and
   a voltage comparator for comparing an output of said integrator to a said specified voltage level.

2. The invention as defined in claim 1 wherein said integrator includes a parasitic capacitance within a signal detector.

3. The invention as defined in claim 1 wherein said integrator includes a parasitic capacitance within a photo-detector.

4. The invention as defined in claim 1 wherein said integrator is a capacitor.

5. The invention as defined in claim 1 further including a filter for filtering an output of said voltage comparator.

6. The invention as defined in claim 1 further including an up/down counter coupled to an output of said voltage comparator.

7. The invention as defined in claim 1 further including a source for precharging said integrator to a specified level.

8. The invention as defined in claim 1 further including a voltage source for precharging said integrator to a specified level.

9. The invention as defined in claim 1 further including a controllable gain driver for driving said source, said controllable gain driver driving said driver as a function of an output of said voltage comparator.

10. The invention as defined in claim 1 wherein said source is an electrically driven optical source.

11. The invention as defined in claim 1 wherein said source is a laser used in a passive optical network.

12. The invention as defined in claim 1 wherein said integrator operates on a per-packet basis.

13. The invention as defined in claim 1 wherein said injected current which is a function of a threshold level is made up of current pulses derived from a current source having a magnitude of said threshold level.

14. The invention as defined in claim 1 wherein said injected current which is a function of a threshold level is made up of current pulses derived from a current source having a magnitude of said threshold level, one pulse for each pulse in said signal representing bits in said packet.

15. The invention as defined in claim 1 wherein said injected current which is a function of a threshold level is made up of current pulses derived from a current source having a magnitude of said threshold level, one pulse for each pulse in said signal representing bits in said packet, and said current pulses derived from a current source of said threshold level being of the same duration as said pulses of said signal representing bits in said packet.

16. A method comprising the steps of:

integrating in an integrator (i) a signal representing bits in a packet generated by a source and (ii) an injected current which is a function of a threshold level, said integrator being first precharged to a specified voltage level; and comparing an output of said integrator to a said specified voltage level.

17. The invention as defined in claim 16 wherein said integrator includes a capacitance.

18. The invention as defined in claim 16 further including the step of filtering a result of said comparing step to generate a filtered result.

19. The invention as defined in claim 16 further including the steps of:

filtering a result of said comparing step to generate a filtered result; and controlling a signal for driving said source in response to said filtered result.

20. The invention as defined in claim 16 wherein said injected current which is a function of a threshold level is made up of current pulses derived from a current source having a magnitude of said threshold level.

21. The invention as defined in claim 16 wherein said injected current which is a function of a threshold level is made up of current pulses derived from a current source having a magnitude of said threshold level, one pulse for each pulse in said signal representing bits in said packet.

22. The invention as defined in claim 17 wherein said injected current which is a function of a threshold level is made up of current pulses derived from a current source having a magnitude of said threshold level, one pulse for each pulse in said signal representing bits in said packet, and said current pulses derived from a current source of said threshold level being of the same duration as said pulses of said signal representing bits in said packet.

23. Apparatus, comprising:

means for integrating (i) a signal representing bits in a packet generated by a source and (ii) an injected current which is a function of a threshold level, said means for integrating being first precharged to a specified voltage level; and means for comparing an output of said means for integrating to a said specified voltage level.

24. The invention as defined in claim 23 wherein said means for integrating includes a capacitance.

25. The invention as defined in claim 23 further including means for filtering an output of said means for comparing to generate a filtered result.

26. The invention as defined in claim 23 further including:

means for filtering an output of said means for comparing to generate a filtered result; and means for driving said source as a function of said filtered result.

27. The invention as defined in claim 23 wherein said means for comparing includes a comparator.

28. The invention as defined in claim 23 wherein said injected current which is a function of a threshold level is made up of current pulses derived from a current source having a magnitude of said threshold level.

29. The invention as defined in claim 23 wherein said injected current which is a function of a threshold level is made up of current pulses derived from a current source having a magnitude of said threshold level, one pulse for each pulse in said signal representing bits in said packet.

30. The invention as defined in claim 23 wherein said injected current which is a function of a threshold level is made up of current pulses derived from a current source having a magnitude of said threshold level, one pulse for each pulse in said signal representing bits in said packet, and said current pulses derived from a current source of said threshold level being of the same duration as said pulses of said signal representing bits in said packet.

31. Apparatus comprising:

a capacitor precharged to a level;

a threshold level supplier; and a comparator;

wherein, for a packet, said capacitor integrates pulses (i) derived from a threshold level supplied by said threshold level supplier and (ii) from a source of said packet, and said comparator generates an output indicative of a comparison between said integrated result of said capacitor and said level to which said capacitor was precharged.

32. The invention as defined in claim 31 wherein at least a portion of said capacitor is part of said source.

33. The invention as defined in claim 31 further including a filter for filtering said output generated by said comparator.

34. The invention as defined in claim 31 further including a controllable gain driver for driving said source as a function of said output generated by said comparator.

35. The invention as defined in claim 31 wherein said pulses derived from said threshold level supplied by said threshold level supplier are current pulses.

36. The invention as defined in claim 31 wherein said pulses derived from said threshold level supplied by said threshold level supplier is made up of current pulses derived from a current source having a magnitude of said threshold level, one pulse for each pulse in said packet.

37. The invention as defined in claim 31 wherein said pulses derived from said threshold level supplied by said threshold level supplier is made up of current pulses derived from a current source having a magnitude of said threshold level, one pulse for each pulse in said packet, and said pulses derived from said threshold level supplied by said threshold level supplier being of the same duration as said pulses of said packet.

* * * * *